United States Patent [19]

Sugai

[11] Patent Number: 5,200,664
[45] Date of Patent: Apr. 6, 1993

[54] SURFACE ACOUSTIC WAVE DEVICE

[75] Inventor: Kazuyoshi Sugai, Tokyo, Japan

[73] Assignee: Clarion Co., Ltd., Tokyo, Japan

[21] Appl. No.: 727,557

[22] Filed: Jul. 9, 1991

[30] Foreign Application Priority Data

Jul. 10, 1990 [JP] Japan .................................. 2-183631

[51] Int. Cl.[5] ............................................. H01H 9/25
[52] U.S. Cl. ............................ 310/313 R; 310/313 D
[58] Field of Search ....................... 310/313 R, 313 D;
333/153, 191, 195

[56] References Cited

U.S. PATENT DOCUMENTS

| 4,019,200 | 4/1977 | Adkins et al. ........................... 357/26 |
| 4,611,140 | 9/1986 | Whitlock et al. ................. 310/313 R |
| 4,683,395 | 7/1987 | Mitsutsuka ....................... 310/313 R |
| 4,943,751 | 7/1990 | Mitsutsuka ....................... 310/313 D |
| 5,028,101 | 7/1991 | Sugai et al. ........................... 333/193 |
| 5,030,930 | 7/1991 | Sugai ..................................... 333/150 |
| 5,043,620 | 8/1991 | Mitsutsuka ....................... 310/313 D |
| 5,111,100 | 5/1992 | Noguchi et al. ................. 310/313 R |

FOREIGN PATENT DOCUMENTS

| 3923952A1 | 1/1990 | Fed. Rep. of Germany . |
| 4015620A1 | 11/1990 | Fed. Rep. of Germany . |
| 2240680 | 8/1991 | United Kingdom . |

OTHER PUBLICATIONS

"Heterojunction Acoustic Charge Transport Devices on GaAs", by William Tanski, Sears Merritt, Robert Sacks, Donald Cullen Emilio Branciforte, Roger Carroll and Timothy Eschrich, *Applied Physics Letter*, vol. 52, No. 1, Jan. 4, 1988, pp. 18–20.

Primary Examiner—Mark O. Budd
Assistant Examiner—Thomas M. Dougherty
Attorney, Agent, or Firm—Flynn, Thiel, Boutell & Tanis

[57] ABSTRACT

In a surface acoustic wave device for removing narrow band signals, detection sensitivity is significantly improved by disposing a group of metal strip arrays on the side opposite to output transducers with respect to input transducers on the surface of a piezo-electric film and connecting a group of diode arrays with this group of metal strip arrays.

12 Claims, 6 Drawing Sheets

SURFACE ACOUSTIC WAVE DEVICE

FIELD OF THE INVENTION

The present invention relates to a narrow band interference signal removing surface acoustic wave device, to which a function of detecting spectrum intensity of an input signal is added, and in particular to an improvement thereof, by which the intensity of a detected signal in a detecting section therein can be increased.

BACKGROUND OF THE INVENTION

One of the problematical points in a spread spectrum communication system using a wide band frequency region is that communication is made impossible or error rate is increased by high level narrow band interference. In order to solve this problem, a filter using surface acoustic wave (hereinbelow abbreviated to SAW) has been proposed.

Figure 7:
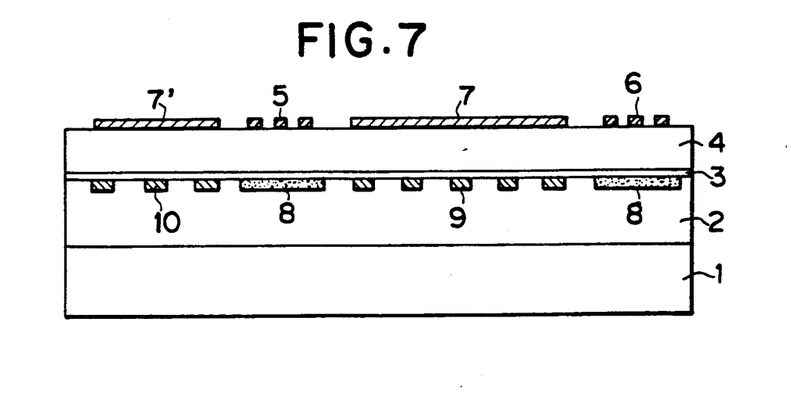
FIG. 7 is a schematical cross-sectional view of a surface acoustic wave element according to the invention disclosed in the older application.
Figure 8:
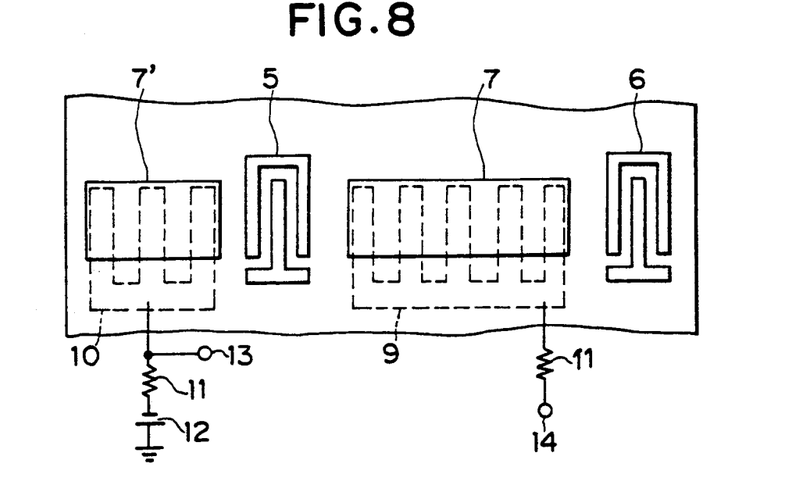
FIG. 8 is a scheme illustrating of the surface acoustic wave element according to the invention disclosed in the older application.
Figure 9:
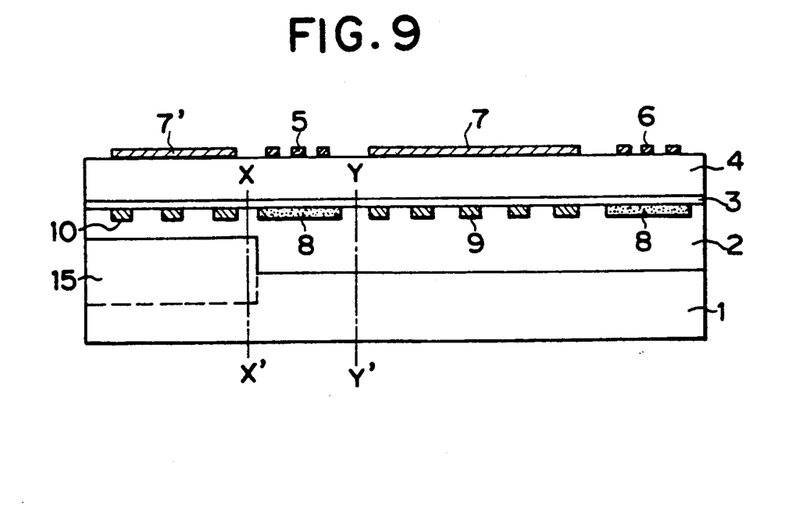
FIG. 9 is a schematical cross-sectional view of another surface acoustic wave element according to the invention disclosed in the older application.

For example, the inventor of this invention has proposed an SAW device indicated in FIGS. 7, 8 and 9 in U.S. Ser. No. 521,142 and U.S. Ser. No. 637,058 in order to intend to improve characteristics of a system adaptable for suppressing narrow band interference, which is useful for the spread spectrum communication.

In the figures, reference numeral 1 is a p' type Si monocrystal substrate; 2 is a p type Si epitaxial layer; 3 is a thermal oxide layer; 4 is a ZnO piezo-electric layer; 5, 6 and 7 are metal electrodes, which are an input transducer, an output transducer and a gate electrode, respectively; 8 is a p' type high impurity concentration diffusion region formed within the epitaxial layer 2 under the input transducer and the output transducer; 9 is an n' type impurity diffusion region formed within the epitaxial layer 2 under the gate electrode; 10 is an n' type impurity diffusion region formed within the epitaxial layer 2 outside of the input transducer 5; and 7' is a gate electrode formed on the piezo-electric layer, corresponding to the n' type impurity diffusion region. A first PN diode array is formed along the SAW propagation path by the n' type impurity diffusion region 9 stated above and a second PN diode array is formed along the SAW propagation path by the n' type impurity diffusion region 10. Several channels, each having the construction described above, are formed. 11 is a resistor connected with the PN diode array 9 or 10; 12 is a DC power supply; and 13 is a voltage signal monitor terminal, through which a voltage signal obtained by converting an input signal into SAW and detecting it by the second PN diode array, the intensity (electric power) of the input signal within the relevant channel (frequency region) being observed as variations in the voltage. Further 14 is a bias control terminal for the first PN diode array.

In the device disclosed in the older application U.S. Ser. No. 521,142 a function of monitoring the spectrum intensity of the input signal is added to a prior art element. In this construction described in the older application, it is necessary that the epitaxial layer is sufficiently thick for obtaining a great variable width of propagation loss of the SAW in the filter portion between the input and the output transducer. However, when the epitaxial layer is thick, it has a drawback that the propagation loss in the detection portion is great, which decreases the intensity of the detected signals. In order to solve this problem, the inventor of the present invention has proposed a construction, in which the epitaxial layer is thick in the filter portion and thin in the detecting portion, as indicated in FIG. 9. Owing to this construction, the detection sensitivity was remarkably improved without giving any influences on filter characteristics. However, since the propagation loss of the SAW due to electro-acoustic (AE) effects, which are interactions between carriers in Si and the potential of the SAW, is not removed perfectly and worsening in the detection sensitivity can not be neglected, there remains still a room for improvement.

OBJECT OF THE INVENTION

The object of the present invention is to provide a surface acoustic wave device having a high performance of an adaptable system for suppressing narrow band interference, useful for the spread spectrum communication system, etc., and capable of improving the detection sensitivity without changing characteristics of the filter portion.

SUMMARY OF THE INVENTION

In order to achieve the above the object, a surface acoustic wave device according to the present invention is characterized in that it comprises a multi-layered body consisting of a first conductivity type high impurity concentration silicon substrate, a first conductivity type silicon epitaxial layer, an insulating film and a piezoelectric film; input transducers for classifying an input signal in the frequency and generating surface acoustic waves in a plurality of propagation paths; output transducers formed on the piezo-electric film for obtaining output signals from the surface acoustic waves propagating in the propagation paths; a group of gate electrodes formed on the piezo-electric film, corresponding to the different propagation paths put between the output and the input transducers; a group of PN diode arrays formed on the front surface of the first conductivity type silicon epitaxial layer in the region between the input and the output transducers; a group of metal strip arrays disposed on the side opposite to the output transducers with respect to the input transducers on the surface of the piezo-electric film; and a group of diodes arrays disposed on the surface of the silicon epitaxial layer and connected with the group of metal strip arrays, respectively.

When the SAWs propagate on the group of metal strip arrays, the potentials of the different metal strips vary in a radio-frequency (RF)-like manner and the RF potentials are taken out by the group of diode arrays in the form of DC voltages to obtain detection signals.

DETAILED DESCRIPTION

Figure 1:
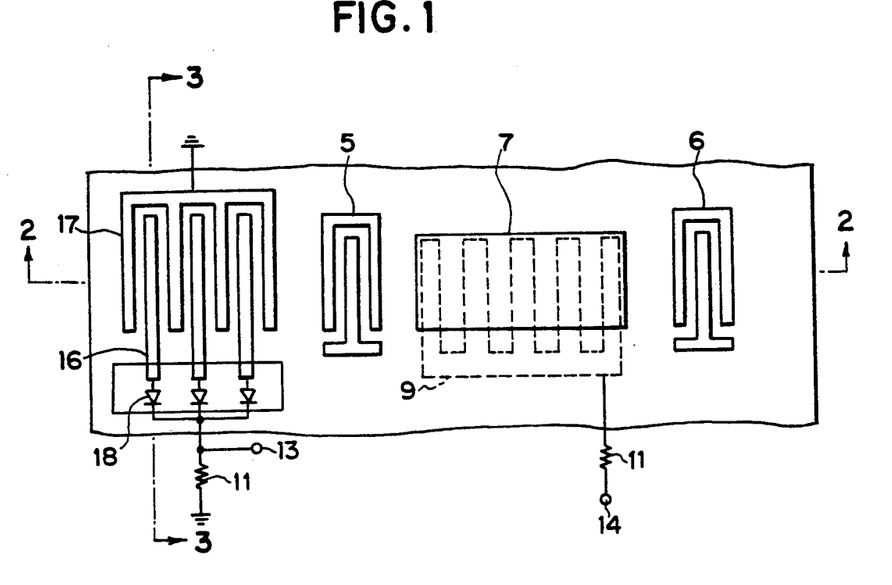
FIG. 1 is a plan view of a surface acoustic wave element, which is an embodiment of the present invention.
Figure 2:
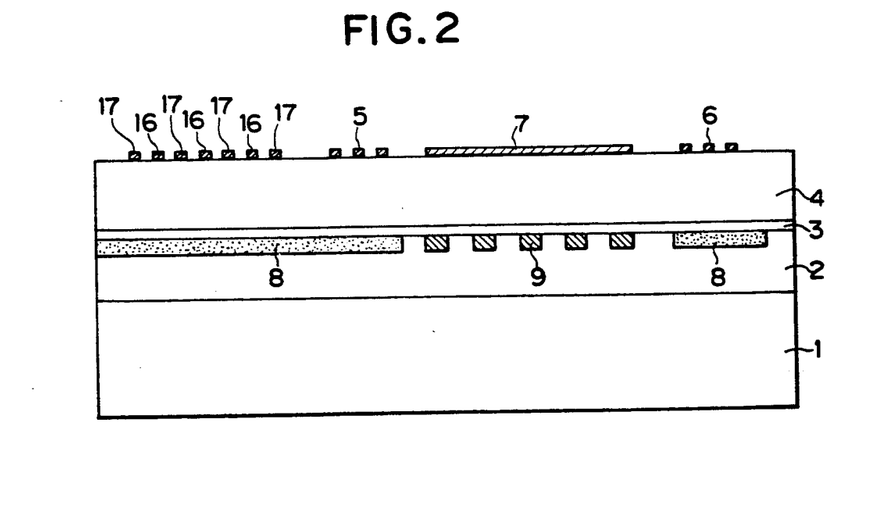
FIG. 2 is a schematical cross-sectional view of the device viewed from a line 2—2 in FIG. 1.
Figure 3:
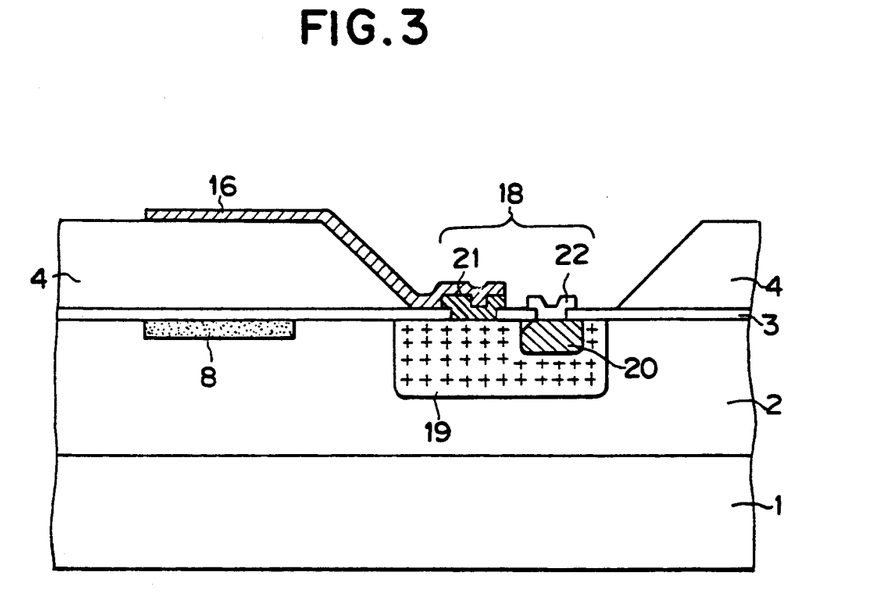
FIG. 3 is a schematical cross-sectional view of the device viewed from a line 3—3 in FIG. 1.

Hereinbelow the present invention will be explained, referring to an embodiment indicated in the drawings. FIGS. 1, 2 and 3 show the construction of an embodiment of one channel of the SAW element according to the present invention having a certain central frequency in a device for removing narrow band interference signals.

In these figures, reference numeral 1 is a p' type Si monocrystal substrate; 2 is a p type Si epitaxial layer; 3 is a thermal oxide layer; 4 is a ZnO piezo-electric layer; 5, 6 and 7 are metal electrodes, which are an input transducer, an output transducer and a gate electrode, respectively; 8 is a p' type high impurity concentration diffusion region formed within the epitaxial layer 2 under the input transducer and the output transducer; 9 is an n' type impurity diffusion region formed within the epitaxial layer 2 under the gate electrode; 16 and 17 are metal strip arrays disposed on the surface of the ZnO piezo-electric layer 4 outside of the input transducer 5 and strip-shaped grounded electrodes, respectively, the p' type high impurity concentration diffusion region 8 under the input transducers 5 extending up to the part under the metal strip arrays 16 and 17; and 18 is a Schottky diode array formed on the surface of the p type Si epitaxial layer 2 outside of the propagation path, different diodes therein being connected with different strips in the metal strip array 16 disposed on the surface of the ZnO piezo-electric layer 4.

A PN diode array is formed along the propagation path of the SAW by the n' type impurity diffusion region 9. 11 us a resistor connected with the PN diode array 9 or the Schottky diode array 18; 13 is a voltage signal monitor terminal, through which signals obtained by converting input signals into SAW and detecting them by the Schottky diode array are outputted so that the intensity (electric power) of the input signals within respective channels (frequency regions) is observed in the form of voltage variations; and 14 is a bias control terminal for the PN diode array.

FIG. 3 indicates an SAW detecting section by a Schottky diode in detail. In the figure, 19 is an n well (region, in which a type impurities are diffused) formed in the p type silicon epitaxial layer 2); 20 is an n' type diffusion region; 21 is a Schottky electrode; and 22 is an ohmic electrode. In the construction described above, a Schottky diode is formed on the surface of the epitaxial layer 2. The ZnO piezo-electric film is formed by etching in a tapered shape and a metal strip is connected with the Schottky electrode. The taper etching of the ZnO piezo-electric film can be easily realized by using an acetic acid solution as an etching solution.

Figure 4:
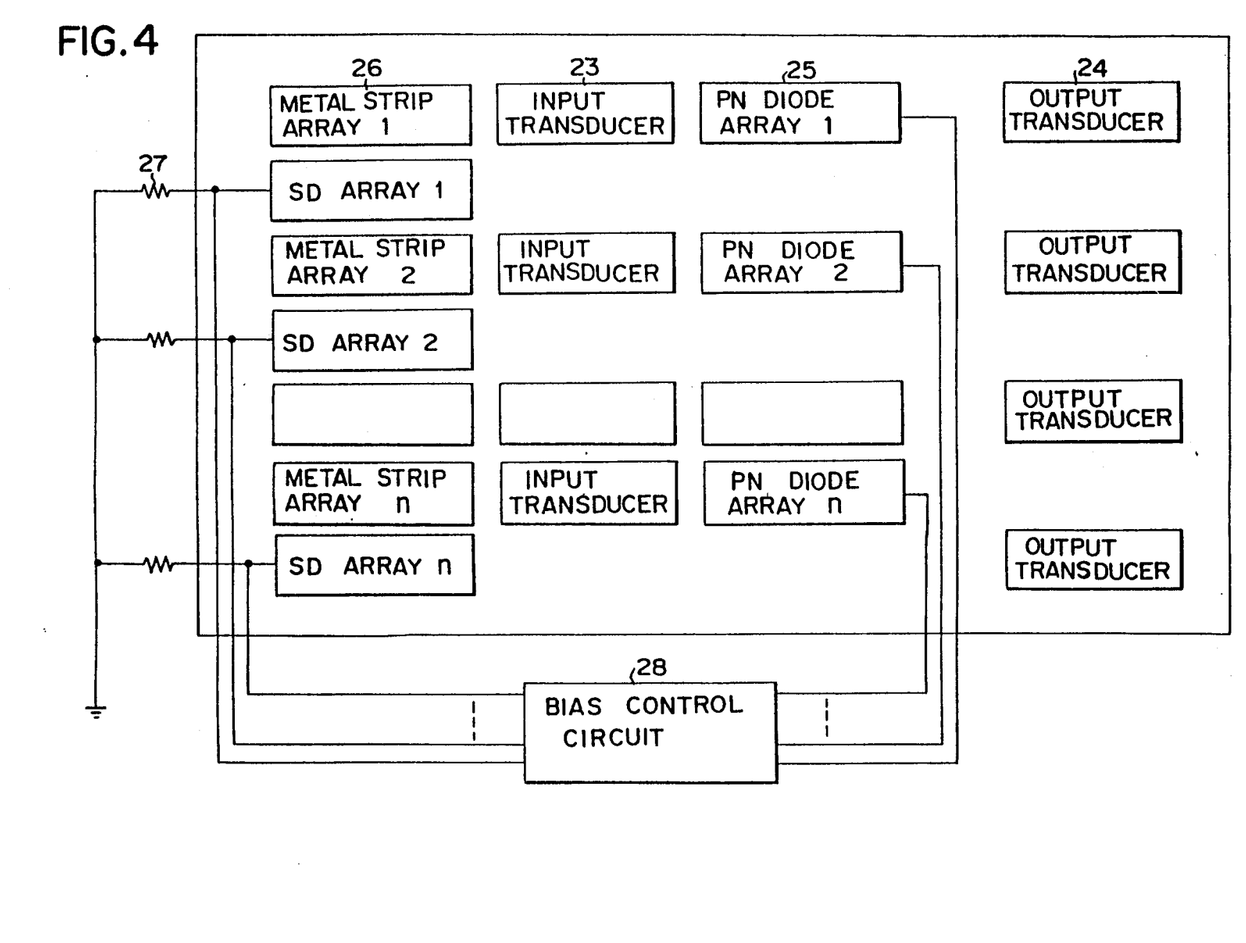
FIG. 4 is a scheme indicating an example of the construction of a narrow band interference suppressing filter system according to the present invention.

FIG. 4 shows an interference wave suppressing system (AISF system), in which a plurality of element constructions described above are integrated on one chip and combined with a bias control circuit, in which 23 is a group of input transducers, which, receiving input signals, produces SAWs in different propagation paths, depending on the frequency; 24 is a group of output transducers for obtaining a synthesized output from the SAWs, which have propagated in the different propagation paths; 25 is a group of PN diode arrays making propagation loss variable for the SAWs, which have propagated in the different propagation paths; a group of detectors, each of which consists of a metal strip array sensing the potential of SAW and a Schottky diode (SD) array producing a square-law detected signal; and 28 a bias control circuit for controlling the output intensity for each channel, responding to the detected signal. The system of FIG. 4 also includes a not-illustrated group of gate electrodes, each gate electrode being disposed above a respective one of the diode arrays in the group 25, just as the gate electrode 7 in FIG. 1 is disposed over the diode array 9.

Next the principle of the detection of the SAW by the metal strip arrays 16, 17 and the Schottky diode array 18 in the embodiment described above.

The SAW produced by the input transducer 5 propagates on the metal strip arrays 16, 17. In the element construction in the embodiment described above, since the p' type high impurity concentration diffusion layer is disposed on the surface of the silicon epitaxial layer 2 under the metal strip arrays 16, 17, no interaction is produced between the potential of the SAW and the carriers. For this reason, no loss of SAW due to the AE effect is produced. The present element differs remarkably from the prior art element at this point. Consequently the propagation loss of the SAW takes place only by crystallographical imperfections of the ZnO piezo-electric film 4 and therefore it has a small value. When the SAW propagates on the strip arrays 16, 17, the potentials of the different metal strips vary in a radio-frequency (RF)-like manner, depending on the potential of the SAW.

This RF potential is applied to the Schottky diode 18 connected to each of the metal strips and a DC signal component due to a non-linear resistance of the Schottky diode is produced. In this way, since a DC current flows through a resistor 11 connected to the Schottky diode, the potential at the voltage signal monitor terminal 13 is shifted, depending on the power of the SAW. The amount of this shift produces a detection signal.

Figure 5:
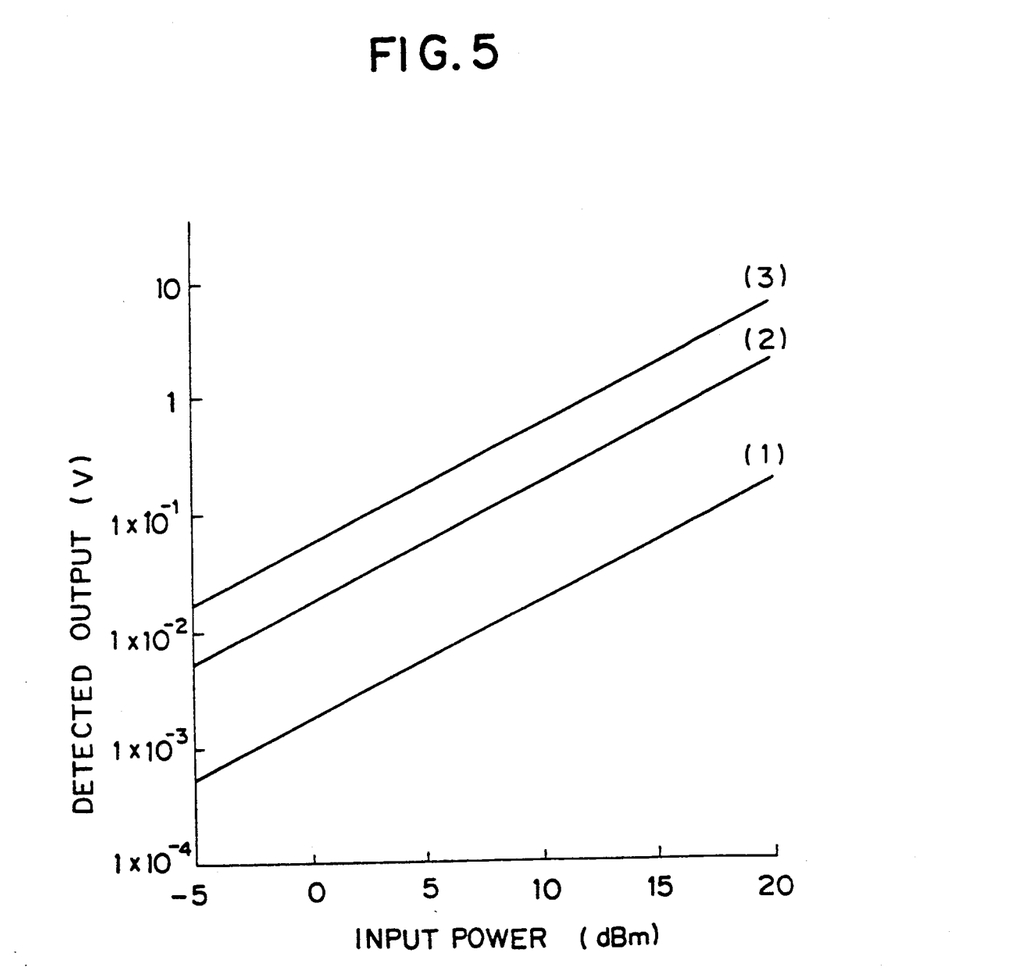
FIG. 5 is a graph indicating the relation between the voltage at an input monitor terminal and the input power in the embodiment described above and the older application.

FIG. 5 shows comparison of the detection sensitivity of the element according to the present invention with that obtained by the prior art technique. The abscissa represents the RF power inputted in the input transducer and the ordinate the voltage value of the detection signal. The conversion loss at the input transducer is about 5 dB and the input frequency is about 215 MHz. In FIG. 5, the line (1) indicates characteristics in the prior art case where the SAW is detected by a PN diode in the state where the epitaxial layer is thick (~10 μm); the line (2) indicates characteristics in the case where the SAW is detected by a PN diode in the state where the epitaxial layer is thin (~2 μm); and the line (3) indicates characteristics in the case where the SAW is detected by a PN diode according to the present invention. As indicated in FIG. 5, the detection signal by the Schottky diode according to the present invention is the greatest and it can be understood that the detection signal is significantly improved. This is owing to the effect that the propagation loss of the SAW is minimized.

Figure 6:
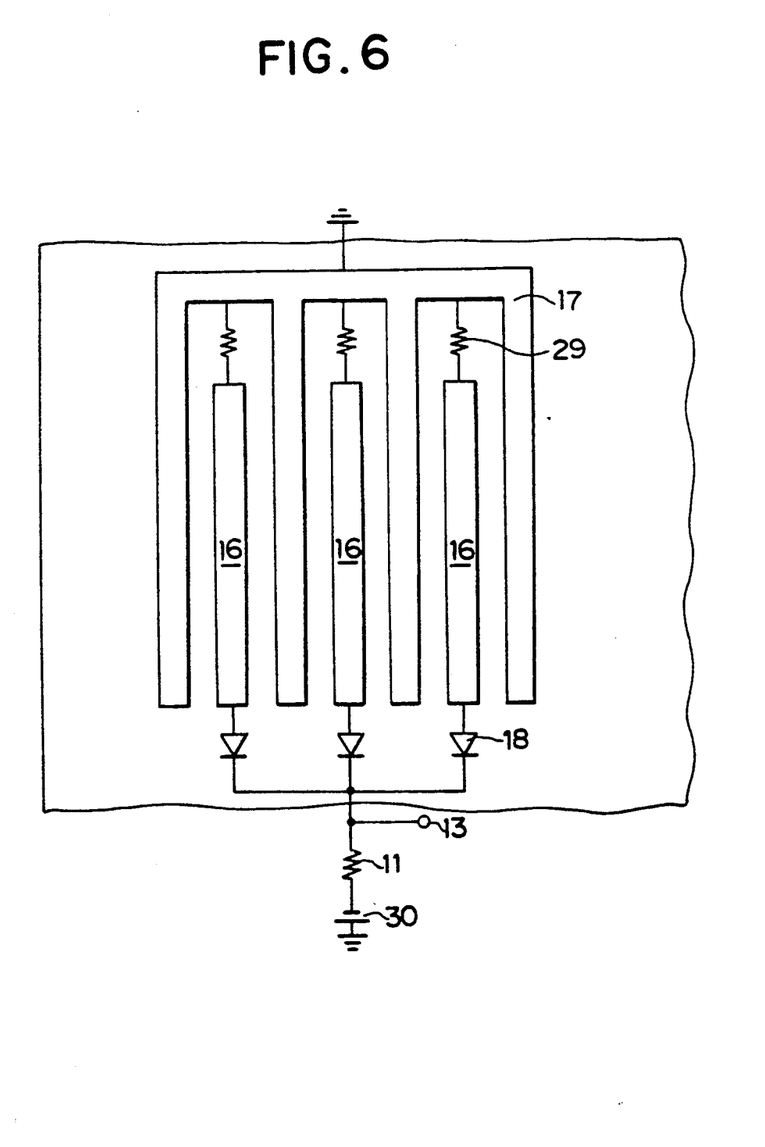
FIG. 6 is a scheme showing a modified example of the embodiment described above.

FIG. 6 indicates the construction of an SAW element, which is another embodiment of the present invention. Although only the detection section is indicated in the figure, the other parts are identical to those indicated in FIGS. 1 to 3 and therefore they are omitted. In the construction indicated in FIG. 6, a DC bias can be applied to the Schottky diode 18 serving as the detector so that it is operated in the optimum state. In the figure, 29 is a high resistance formed between the metal strip 16 and the grounded strip 17; and 30 is a DC bias power source. The resistor 29 should have a high resistance greater than several tens of kΩ in order to prevent the decrease in the SAW potential. The optimum bias depends on the kind of the metal, of which the Schottky electrode is made, but it is about 100 mV. As means for making this high resistance there are a resistor formed by diffusion in the silicon layer, a thin film resistor made of polycrystalline silicon, a high resistance realized by forming an extremely thin film of metal such as Cr, Ti, W, Ni, etc. on the surface of the ZnO piezo-electric film before the formation of the strip electrodes, etc. In this way it is possible to increase further the detection sensitivity.

As clearly seen from the above description, according to the present invention, following effects can be obtained.

(1) Since the detection sensitivity is remarkably increased, the RF power inputted in the element is reduced. Therefore the system is simplified and at the same time it is possible to intend to reduce consumed power.

(2) Notch characteristics of the filter are controlled by controlling the bias applied to the diode, response time is extremely short.

(3) The time necessary for the detection is short (the response time of the detector is short).

(4) There is no restriction on the number of narrow band high level interference signals and adaptable suppression is possible.

(5) An adaptable system for suppressing interference waves can be constructed in a monolithic manner and thus it is possible to intend to simplify the system and to reduce the size thereof. In addition, productivity of the element is good.

The embodiments of the invention in which an exclusive property or privilege is claimed are defined as follows:

1. A surface acoustic wave device comprising:
    a multi-layered body which includes a first conductivity type high impurity concentration silicon substrate; a first conductivity type silicon epitaxial layer; an insulating film and a piezo-electric film;
    input transducers formed on said piezo-electric film for classifying an input signal in the frequency and generating surface acoustic waves in a plurality of propagation paths;
    output transducers formed on said piezo-electric film for obtaining output signals from the surface acoustic waves propagating in the propagation paths;
    a group of gate electrodes formed on said piezo-electric film, corresponding to the different propagation paths put between said output and said input transducers;
    a group of PN diode arrays formed on a top surface of said first conductivity type silicon epitaxial layer in the region between said input and said output transducers;
    a group of metal strip arrays disposed on a side of said output transducers opposite from said input transducers on the surface of the piezo-electric film; and
    a second group of diode arrays disposed on the surface of said silicon epitaxial layer and connected with the group of metal strip arrays, respectively.

2. A surface acoustic wave device according to claim 1, wherein a high impurity concentration diffusion region is formed in a surface portion of said first conductivity type silicon epitaxial layer under said group of metal strip arrays.

3. A surface acoustic wave device according to claim 1, wherein said second group of diode arrays is composed of Schottky diodes.

4. A surface acoustic wave device according to claim 3, wherein each of said Schottky diodes includes:
    a second conductivity type well region formed on a surface of said first conductivity type silicon epitaxial layer;
    a second conductivity type high impurity concentration diffusion region formed on a surface of said second conductivity type well region;
    a Schottky electrode formed on said second conductivity type well region; and
    an ohmic electrode formed on said second conductivity type high impurity concentration diffusion region;
    wherein said Schottky electrode is connected with a respective strip of said group of metal strip arrays.

5. A surface acoustic wave device comprising: a substrate having a surface, an epitaxial layer provided on said surface of said substrate and having a surface on a side thereof remote from said substrate; an insulating layer provided on said surface of said epitaxial layer and having a surface on a side thereof remote from said epitaxial layer; a piezo-electric layer provided on said surface of said insulating layer and having a surface on a side thereof remote from said insulating layer; an input transducer and an output transducer provided on said surface of said piezo-electric layer at spaced locations; a gate electrode provided on said surface of said piezo-electric layer between said input transducer and said output transducer; an array of first diodes provided on said surface of said epitaxial layer substantially in alignment with said gate electrode; an array of conductive strips provided on said surface of said piezo-electric layer on a side of said input transducer remote from said output transducer; and a plurality of second diodes each having an anode connected to a respective one of said conductive strips, said second diodes having cathodes which are connected to each other.

6. An apparatus according to claim 5, including a resistor having a first end connected to said cathodes of said diodes and having a second end connected to ground.

7. An apparatus according to claim 5, including a resistor having a first end connected to said cathodes of said diodes and having a second end connected to a DC bias power source.

8. An apparatus according to claim 5, including a plurality of strip-shaped electrodes which are arranged interdigitally between said conductive strips and are each connected to ground.

9. An apparatus according to claim 5, including a high impurity concentration diffusion region provided at said surface of said epitaxial layer below said output transducer, and a high impurity concentration diffusion region provided on said surface of said epitaxial layer below said input transducer and said conductive strips.

10. A surface acoustic wave device according to claim 5, wherein each of said second diodes is a Schottky diode.

11. An apparatus according to claim 10, wherein said epitaxial layer is a first conductivity type silicon, and wherein each Schottky diode includes a well region of a second conductivity type formed in said epitaxial layer adjacent said insulating layer, a high impurity concentration diffusion region of said second conductivity type formed in said well region adjacent said insulating layer, a Schottky electrode formed on said well region and connected to a respective one of said conductive strips, and an ohmic electrode formed on said high impurity concentration diffusion region.

12. A surface acoustic wave device according to claim 11, wherein said Schottky electrode and said ohmic electrode of each said Schottky diode extend through said insulating layer.

* * * * *